United States Patent
Wei (10) Patent No.: US 8,275,153 B2
(45) Date of Patent: Sep. 25, 2012

(54) SYSTEM AND METHOD FOR GENERATING AN AUDIO GAIN CONTROL SIGNAL

(75) Inventor: Jeff Wei, Richmond Hill (CA)

(73) Assignee: Evertz Microsystems Ltd., Burlington (CA)

( * ) Notice: Subject to any disclaimer, the term of this patent is extended or adjusted under 35 U.S.C. 154(b) by 1241 days.

(21) Appl. No.: 11/971,300

(22) Filed: Jan. 9, 2008

(65) Prior Publication Data

US 2008/0253586 A1 Oct. 16, 2008

Related U.S. Application Data

(60) Provisional application No. 60/912,007, filed on Apr. 16, 2007.

(51) Int. Cl.
*H03G 3/00* (2006.01)

(52) U.S. Cl. .............. 381/104; 381/58; 381/107

(58) Field of Classification Search .......... 381/104, 381/107, 56–59, 102, 106; 348/738
See application file for complete search history.

(56) References Cited

U.S. PATENT DOCUMENTS

| | | | |
|---|---|---|---|
| 7,072,477 B1 | 7/2006 | Kincaid | |
| 2002/0064288 A1* | 5/2002 | Walker | 381/94.7 |
| 2003/0059064 A1 | 3/2003 | Hankins et al. | |
| 2004/0213420 A1 | 10/2004 | Gundry et al. | 381/104 |
| 2007/0154032 A1* | 7/2007 | Kawamura et al. | 381/94.1 |
| 2007/0291959 A1* | 12/2007 | Seefeldt | 381/104 |
| 2009/0067644 A1* | 3/2009 | Crockett et al. | 381/98 |

FOREIGN PATENT DOCUMENTS

| | | |
|---|---|---|
| WO | 2005098818 A1 | 10/2005 |
| WO | WO2005098818 | * 10/2005 |

OTHER PUBLICATIONS

Esben Skovenborg & Soren Nielsen, "Evaluation of Different Loudness Models with Music and Speech Material", Oct. 28, 2004.*
Jesko Verhey & Birger Kollmeier, "Spectral loudness summation as a function of duration", accepted Dec. 19, 2001.*
Sandvold, V., Herrera, P., "Towards a Semantic Descriptor of Subjective Intensity in Music", posted on the McGill University Website on Sep. 10, 2005; retrieved from www.music.mcgill.ca/~ich/research/misc/papers/cr1244 on Jun. 10, 2010.

(Continued)

*Primary Examiner* — Kimberly Rizkallah
*Assistant Examiner* — Duy T Nguyen
(74) *Attorney, Agent, or Firm* — Bereskin and Parr LLP/S.E.N.C.R.L., s.r.l.

(57) ABSTRACT

Embodiments of a system and method of controlling the loudness of an audio signal are disclosed. The method includes determining a long term loudness level for the audio signal over a first sliding time period, determining a short term loudness level for the audio signal over a second sliding time period where the second sliding time period is shorter than the first sliding time period, detecting a segment transition in the audio signal; and generating a gain control signal. The gain control signal is based on the short term loudness level for a first time interval after a segment transition and the gain control signal is based on the long term loudness level after the expiration of the first time interval. Other embodiments include addition signal analysis steps to identify different segments of a signal and to control the loudness of the segments.

23 Claims, 5 Drawing Sheets

OTHER PUBLICATIONS

Lund, Thomas, "Realtime Loudness Control for Broadcast" TC Electronic A/S, Denmark, May 12, 2005 retrieved from www.broadcastpapers.com on Jun. 10, 2010.

"ITU-R 468 Noise Weighting", accessed at http://en.wikipedia.org/wiki/ITU-R_468_noise_weighting on Nov. 4, 2007.

"A-weighting", accessed at http://en.wikipedia.org/wiki/A-weighting on Nov. 4, 2007.

"A-weighting in Detail", accessed at http://www.lindos.co.uk/cgi-bin/FlexiData.cgi?SOURCE=Articles&VIEW=full&id=2 on Nov. 4, 2007 (printed on Dec. 16, 2011).

"Loudness and Format Control—Solutions for TV Broadcast", 2006 NAB BEC Proceedings at p. 63.

Lund, Thomas, "Control of Loudness in Digital TV", 2006 NAB BEC Proceedings at p. 57.

Skovenborg E., et al. "Evaluation of Different Loudness Models with Music and Speech Material", AES Convention Paper, San Francisco, Oct. 28, 2004.

Verhey, J., et al. "Spectral loudness summation as a function of duration", 2002 Acoustical Society of America at p. 1349.

\* cited by examiner

SYSTEM AND METHOD FOR GENERATING AN AUDIO GAIN CONTROL SIGNAL

This is an application claiming the benefit under 35 USC 119(e) of U.S. Provisional Patent Application Ser. No. 60/912,007 filed Apr. 16, 2007. U.S. Ser. No. 60/912,007 is incorporated herein, in its entirety, by this reference to it.

TECHNICAL FIELD

This invention relates to systems and methods for controlling audio loudness.

BACKGROUND

The loudness levels of many audio signals vary in a manner that some listeners find objectionable. One example is the audio signal in many audio/video signals such as television signals. During a program segment of the television signal, the audio signal has a relatively lower loudness level. Viewers will tend to set the volume on their televisions (or other audio reproduction equipment) based on this relatively lower loudness level. During commercial segments, the audio level is often at a relatively higher audio level. Some television viewers find the higher loudness level annoying. Other examples include audio only signals, such as FM radio signals where some segments of a radio broadcast may have a higher volume level than other segments.

Accordingly, it is desirable to differentially control the audio loudness of different segments of an audio signal.

SUMMARY

One embodiment relates to a method of generating a gain control signal comprising: determining a long term loudness level for an audio signal over a first sliding time period; determining a short term loudness level for the audio signal over a second sliding time period wherein the second sliding time period is shorter than the first sliding time period; detecting a segment transition in the audio signal; and generating a gain control signal, the gain control signal is based on the short term loudness level for a first time interval after a segment transition and the gain control signal is based on the long term loudness level after the expiration of the first time interval.

In some embodiments at least one of long term loudness level and the short term loudness level are determined using a frequency weighted Leq loudness model. The frequency weighted Leq loudness model may be a revised low frequency B-weighted Leq (RLB) loudness model.

In some embodiments only portions of the audio signal that are above a listener loudness perception threshold are used to determine the long term loudness level and/or the short term loudness level.

In some embodiments the first sliding time period is at least ten times longer than the second sliding time period. For example, the first sliding time period may be greater than or equal to 10 seconds and the second sliding time period may be less than or equal to 1 second.

In some embodiments detecting a segment transition includes detecting a portion of the audio signal with a magnitude less than a selected transition audio threshold for a selected transition time threshold. The selected transition audio threshold may be approximately −65 dB and the selected transition time threshold may be approximately 100 milliseconds.

In some embodiments the audio signal is part of an audio/video signal that includes a video signal and detecting a segment transition includes simultaneously detecting a quiet portion of the audio signal and one of a black video portion and a scene change in the video signal.

In some embodiments the gain control signal is generated to achieve a target loudness. The target loudness may be determined from a target loudness signal.

In some embodiments the short and long term loudness levels are determined recursively.

In some embodiments the method further comprises determining a second long term loudness level for the audio signal over a third sliding time period wherein the third sliding time period is shorter than the first sliding time period and longer than the second sliding time period; and wherein the gain control signal is based on the short term loudness level for the first time interval after a segment transition, the gain control signal is based on the second long term loudness level for a second time interval after the expiration of the first time interval, and the gain control signal is based on the long term loudness level after the expiration of the second time interval.

In some embodiments the audio signal includes loud segments and normal segments and the second time interval is approximately equal to an average length of the loud segments.

In some embodiments the first sliding time period is 180 seconds, the second sliding time period is 300 milliseconds and the third sliding time period is 22 seconds.

In some embodiments the first time interval is 10 seconds and the second time interval is 30 seconds.

In some embodiments the method further includes determining a plurality of medium term loudness levels for the audio signal, wherein each medium term loudness level is determined over a unique third sliding time period that is shorter than the first sliding time period and longer than the second sliding time period; and wherein the gain control signal is based on the short term loudness level for the first time interval after the segment transition, after expiration of the first time interval the gain control signal is based on the medium term loudness levels in series, each for a unique third time interval, and after expiration of all the unique third time intervals the gain control signal is based on the long term loudness level.

A second embodiment provides a system for generating a gain control signal comprising: an input terminal for receiving an audio signal; a long term loudness level block for determining a long term loudness level for the audio signal over a first sliding time period; a short term loudness level block for determining a short term loudness level for the audio signal over a second sliding time period wherein the second sliding time period is shorter than the first sliding time period; a segment and transition detection block for detecting segment transitions in the audio signal; a switch for generating a loudness level signal, the loudness level signal is equal to the short term loudness level for a first time interval after a segment transition and the loudness level signal is equal to the long term loudness level after the expiration of the first time interval; and a gain calculation block for generating a gain control signal, the gain control signal is based on the loudness level signal.

In some embodiments the system further includes a second long term loudness level block for determining a second long term loudness level for the audio signal over a third sliding time period; and wherein the loudness level signal is equal to the short term loudness level for a first time interval after a segment transition, the loudness level signal is equal to the second long term loudness level for a second time interval after the expiration of the first time interval, and the loudness level signal is equal to the long term loudness level after the expiration of the second time interval.

In some embodiments the system further includes a second input terminal for receiving a target gain signal and wherein the gain control signal is generated to achieve the magnitude of the target gain signal.

In some embodiments the system further includes a first feedback loop for feeding the loudness level signal to the long term loudness level detection block so that the long term loudness level can be determined recursively; and a second feedback loop for feeding the loudness level signal to the short term loudness level detection block so that the long term loudness level can be determined recursively.

A third embodiment provides a method of generating a gain control signal comprising: determining a long term loudness level for an audio signal over a first sliding time period; detecting a segment transition after detecting a segment transition: continuing to determine the long term loudness level for the audio signal; determining a short term loudness level over a second sliding time period wherein the second sliding time period is shorter than the first sliding time period; and if the short term loudness level differs from the long term loudness level according to a selected criteria, then generating a gain control signal in accordance with the difference between the short term loudness level and the long term loudness level.

In some embodiments the audio signal is an audio component of an audio/video signal and detecting a segment transition includes detecting a trigger signal, such as commercial insertion cue.

In some embodiments the audio signal is an audio component of an audio/video signal that includes a video signal and detecting a segment transition includes simultaneously detecting a quiet portion of the audio signal and one of a black video portion and a scene change in the video signal.

In some embodiments the audio signal is an audio component of an audio/video signal that also includes a video signal and detecting a segment transition includes simultaneously detecting a quiet portion of the audio signal and one of a black video portion or a scene change in the video signal for at least a selected time period. The selected time period may be equal to or greater than 30 milliseconds.

In some embodiments detecting a segment transition includes detecting a quiet portion of the audio signal.

In some embodiments detecting a segment transition includes detecting a portion of the audio signal with a magnitude of less than about −65 dB for a period at least about 100 milliseconds.

In some embodiments the selected criteria is that the short term loudness level is a selected proportion of the long term loudness level, wherein the selected proportion is greater than 100%.

In some embodiments the selected criteria is that the short term loudness level is at least 110% of the long term loudness level for at least 50% of period over a period of 10 seconds.

In some embodiments the selected criteria is that the short term loudness level differs from the long term loudness level by a selected proportion, wherein the selected proportion is 10% for at least 50% of period over a period of 10 seconds.

In some embodiments the first sliding time period is at least 5 times longer than the second sliding time period.

In some embodiments the first sliding time period is at least 10 times longer than the second sliding time period.

In some embodiments the first time period is more than about 10 seconds and wherein the second time period is less than about 1 second.

In some embodiments the second time period is less than about 10 seconds.

In some embodiments the first time period is more than about 1 second.

In some embodiments the long and short term loudness levels are determined using a frequency weighted Leq loudness model.

In some embodiments the long and short term loudness levels are determined using a revised low-frequency B-weighted Leq (RLB) loudness model.

A fourth embodiment provides a method of controlling the loudness of frequently repeated segments in an audio signal comprising: generating a signature for a selected portion of segments of the audio signal; identifying frequently repeated segments of the audio signal; detecting a frequently repeated segment by comparing the signature of a segment with signatures of previously identified frequently repeated segments attenuating the loudness of the audio signal when a segment is identified as a previously identified frequently repeated segment is detected In some embodiments the selected portion of each segment is an initial selected portion of the segment.

In some embodiments the selected portion of each segment is the first 2 seconds of the segment.

A fifth embodiment discloses a system of for generating a gain control signal comprising: an input terminal for receiving an audio signal; a long term loudness level block for determining a long term loudness level for the audio signal over a first sliding time period; a short term loudness level block for determining a short term loudness level for the audio signal over a second sliding time period wherein the second sliding time period is shorter than the first sliding time period; and a gain calculation block for generating a gain control signal in accordance with the difference between the short term loudness level and the long term loudness level.

BRIEF DESCRIPTION OF THE DRAWINGS

For a better understanding of embodiments of the systems and methods described herein, and to show more clearly how they may be carried into effect, reference will be made, by way of example, to the accompanying drawings in which.

DETAILED DESCRIPTION

Figure 1:
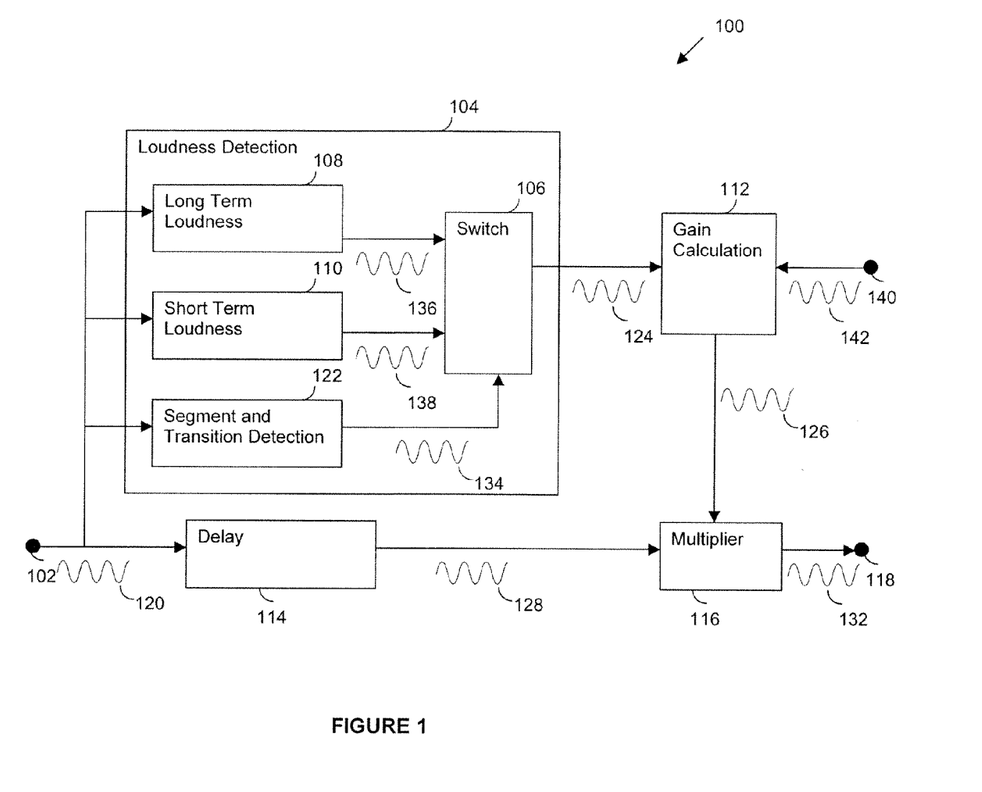
FIG. 1 schematically illustrates a loudness control system in accordance with an embodiment.

Reference is first made to FIG. 1, which illustrates a loudness control system 100. The loudness control system 100 has an input terminal 102, a loudness detection block 104, a gain calculation block 112, a delay block 114, a multiplier 116 and an output terminal 118. The loudness detection block 104 includes a switch 106, a long term loudness level block 108, a short term loudness level block 110 and a segment and transition detection block 122.

Figure 2:
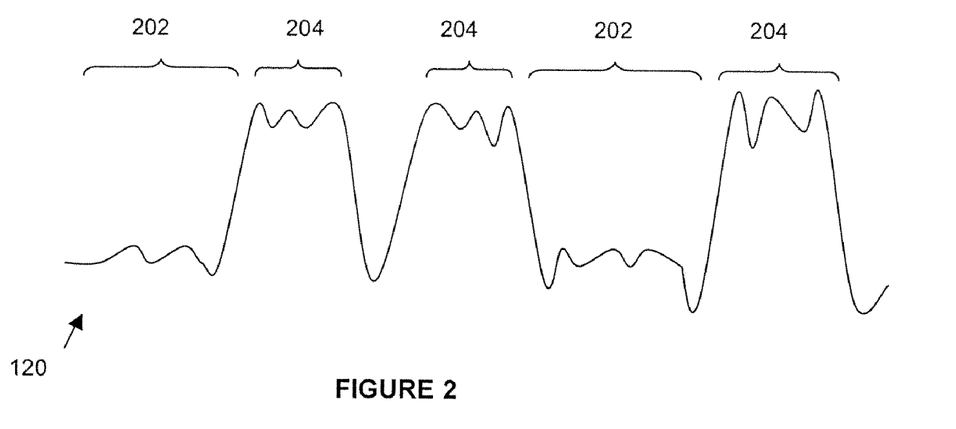
FIG. 2 illustrates an input audio signal with varying loudness levels.

An input audio signal 120 is received at input terminal 102. Referring briefly to FIG. 2, an example input audio signal 120 is illustrated. The input audio signal 120 may be an audio only signal or may be an audio component of an audio video signal. The input audio signal 120 may be a mono audio, a stereo audio, or a multi-channel audio signal. The input audio signal 120 may be a digital signal or an analog signal and the various components of the loudness detection system 100 are selected to suitably analyze and process the input audio signal 120. The input audio signal 120 includes at least two different types of segments. Typically, the input audio signal 120 will include normal loudness segments or normal segments 202 and loud segments 204. The normal segments 202 are portions of the input signal audio signal 120 that define the normal or typical loudness level for the input audio signal 120. Where the input audio signal 120 is a broadcast radio signal or the audio portion of a broadcast television signal, the normal segments typically correspond to program segments of the broadcast signal. Program segments are segments of a broadcast program such as a radio program or a television show. The loud segments 204 are portions of the input audio signal 120 that have a higher loudness level than the normal segments 202. In a broadcast signal, at least some of the loud segments will often correspond to commercial segments, which may be advertising and other promotional segments. In some cases, a commercial in a broadcast will have a normal loudness level while other commercials correspond to loud segments of the input audio signal 120. In other cases, certain programs will be louder than other programs.

In one embodiment, the loudness (or amplitude or magnitude) of the input audio signal 120 is higher during loud segments 204 than during normal segments 202. In general, although not necessarily, the total length of normal segments 202 of the input audio signal 120 will be longer than the total length of the loud segments 204 from the beginning to the end of a typical program. For example, a typical 18 minute long program may be broadcast in 4 normal segments over a 28 minute period that includes several loud commercial segments with a total length of 8 minutes. The remaining time may be consumed with other types of segments or non-signal periods such as silent periods.

The input audio signal 120 received at the input terminal 102 is input to the long term loudness level block 108, the short term loudness level block 110, the segment and transition detection block 122 and the delay block 114.

The long term loudness level block 108 calculates a long term loudness level 136 for the input audio signal 120. The long term loudness level 136 corresponds to an average loudness level of the input audio signal 120 over the sliding time period $T_l$. In one embodiment, the long term loudness level block 108 calculates the long term loudness level 136 using a frequency weighted $L_{eq}$ loudness model according to the equation $$L_{eq}(W)_l = 10\log_{10}\left[\frac{1}{N_l}\sum_{N_l}\frac{x_w^2(n)}{x_{ref}^2}\right]$$

where $L_{eq}(W)_l$ is the frequency weighted long term loudness level, $x_{ref}$ is a reference level ($x_{ref}$ will typically be selected based on the frequency weighting model used or based on a selected criteria; for example, $x_{ref}$ may be selected such that a full scale 1 kHz tone is measured at a selected loudness level such as 3 dB or 0 dB), $x_w(n)$ corresponds to a series of samples x(n) over the sliding time period $T_l$ that contains $N_l$ audio samples which have been passed through a frequency weighted filter and W represents the frequency weighting model used to pre-process audio samples x(n) to provide the frequency weighted audio samples $x_w(n)$.

Many different frequency weighting models may be used. In one embodiment, the well known RLB-weighting model is used. Any other frequency weighting model may be used including A, B, C, D, or M frequency weighting models. The $L_{eq}$ model provides a time averaged sound level. Any other model for calculating the loudness level of an audio signal may be used. For example, a loudness measure that calculates the energy of the input audio signal 120 may be used rather than a model which calculates a dB loudness level. Examples of some loudness level models are discussed in Skovenberg and Nielson, "Evaluation of Different Loudness Models with Music and Speech Material", AES 117th Convention, October 2004 (Convention Paper 6234).

In another embodiment, no frequency weighting is applied.

While all portions of the input audio signal 120 may be used to determine the long term loudness level 136, a listener may perceive loudness of an audio signal based primarily on portions of the audio signal that have an audio magnitude exceeding a selected listener loudness perception threshold. Accordingly, in another embodiment, only portions of the input audio signal 120 that have a magnitude exceeding the listener loudness perception threshold are used to determine the long term loudness level 136 ($L_{eq}(W)_l$). In this embodiment, the long term loudness level can be represented by the following equation $$L_{eq}(W)_l = 10\log_{10}\left[\frac{1}{N_{q=1}}\sum_{N_l}\frac{x_w^2(n)q_l(n)}{x_{ref}^2}\right]$$

where $q_l(n)$ is a weighting function with values of 0 and 1 and $N_{q=1}$ is the number of samples with $q_l(n)$ equal to 1. When the input audio signal 120 is below the listener loudness perception threshold, $q_l(n)$ is set to 0, when the input audio signal 120 meets or exceed the threshold, $q_l(n)$ is set to 1.

The short term loudness level block 110 calculates a short term loudness level 138 for the input audio signal 120. The short term loudness level 138 corresponds to an average loudness level of the input audio signal 120 over the sliding time period $T_s$. In one embodiment, the short term loudness level block 110 calculates the short term loudness level 138 using a frequency weighted $L_{eq}$ loudness model according to the equation $$L_{eq}(W)_s = 10\log_{10}\left[\frac{1}{N_s}\sum_{N_s}\frac{x_w^2(n)}{x_{ref}^2}\right]$$

where $L_{eq}(W)_s$ is the frequency weighted short term loudness level, $x_{ref}$ is a reference level, and $x_w(n)$ corresponds to a series of samples x(n) over the sliding time period $T_s$ that contains $N_s$ audio samples which have been passed through a frequency weighted filter.

In some embodiments the short term loudness level 138 will be calculated using the same frequency weighting model as the long term loudness level 136. In other embodiments, different frequency weighting models are used for the two calculations.

In one embodiment, only portions of the input audio signal 120 that have a magnitude exceeding a listener loudness perception threshold are used to determine the short term loudness level 138 ($L_{eq}(W)_s$). In this embodiment, the short term loudness level 138 can be represented by the following equation $$L_{eq}(W)_s = 10\log_{10}\left[\frac{1}{N_{q=1}}\sum_{N_s}\frac{x_w^2(n)q_s(n)}{x_{ref}^2}\right]$$

where $q_s(n)$ is a weighting function with values of 0 and 1 and $N_{q=1}$ is the number of samples with $q_s(n)$ equal to 1. When the input audio signal 120 is below the listener loudness perception threshold, $q_s(n)$ is set to 0, when the input audio signal 120 meets or exceed the threshold, $q_s(n)$ is set to 1. The loudness perception threshold used in determining the short term loudness level 138 may be the same as or different from the loudness perception threshold used in determining the short term loudness level 136.

The time period $T_l$ over which $N_l$ samples are collected to calculate the long term loudness level 136 is relatively long compared to the time period $T_s$ over which $N_s$ samples are collected to calculate the short term loudness level 138. By making the time period $T_l$ significantly longer than the time period $T_s$, the short term loudness level 138 is responsive to immediate changes in the input audio signal 120 whereas the long term loudness level 136 represents the long term average and ignores short term variations. Accordingly, the long term loudness level 136 is used for slowly tracking the average loudness level of the input audio signal 120 whereas the short term loudness level 138 is used for quick adjustment to a new level where a new segment has a different level from the previous segment.

In one embodiment, the time period $T_l$ is 180 seconds and the time period $T_s$ is 300 milliseconds. However, other time periods may also be used for $T_l$ and $T_s$. If it is desirable to preserve the dynamic range of normal segments, it is preferable to use a longer time period for $T_l$. In one embodiment time period $T_s$ is less than 1 second so that the short term loudness level 138 is responsive to a sudden increase in the loudness level of the audio input signal 120. Typically, the time period $T_l$ will be at least ten times longer than the time period $T_s$.

The segment and transition detection block 122 detects segment transitions in the input audio signal 120 and outputs a segment transition signal 134. When a segment transition is detected, the segment transition signal 134 is set to 1 or Yes or True. At other times, the segment transition signal 134 is set to 0 or No or False.

In one embodiment the segment and transition detection block 122 detects a segment transition when the input audio signal 120 has audio magnitude or level that remains below a selected transition audio threshold for a selected transition time threshold. For example, if the input audio signal has a magnitude of less than −65 dB for a period of 100 milliseconds.

Where the input audio signal 120 is part of an audio/video signal received at input terminal 102, the segment and transition detection block 122 may analyze both the audio and video portions of the signal to determine if a segment transition has occurred. For example, the segment and transition detection block 122 may analyze the audio signal for a quiet portion of the audio signal and the video signal for a black portion. If the quiet portion has a magnitude less than a selected threshold and the video signal simultaneously has a black screen, then the segment and transition detection block 122 detects a transition.

The switch 106 is coupled to the long term loudness level block 108, the short term loudness level block 110 and the segment transition and detection block 122 and receives as inputs the long term loudness level 136 ($L_{eq}(W)_l$), the short term loudness level 138 ($L_{eq}(W)_s$), and the segment transition signal 134. The switch 106 outputs a loudness level signal 124 (L(n)). The loudness level signal 124 (L(n)) is set to one of the long term loudness level 136 and the short term loudness level 138 based on the segment transition signal 134. In one embodiment, the switch 106 selects the short term loudness level 138 when the segment transition signal 134 is set to 1 or Yes or True. The switch 106 then remains in this position for the time interval $T_x$. After the $T_x$ interval ends and until the next segment transition, the switch 106 selects the long term loudness level 136.

The gain calculation block 112 receives the loudness level signal 124 (L(n)) from the switch 106 and calculates a gain control signal 126 (G(n)). As noted above, the loudness level signal 124 is equal to either the long term loudness level 136 ($L_{eq}(W)_l$) or the short term loudness level 138 ($L_{eq}(W)_s$) output by the long term loudness level block 108 and the short term loudness level block 110 respectively. In one embodiment the gain control signal 126 (G(n)) is generated according to the following equation to achieve a target loudness ($g_t$).

$$G(n) = x_{ref}10^{\frac{g_t-L(n)}{20}}$$

The gain control signal 126 may be normalized to the target magnitude with the equation:

$$G(n) = x_{ref}10^{\frac{g_t-\max(L_{eq}(W)_l, L_{eq}(W)_s)}{20}}$$

By using the maximum of the long and short term loudness levels to calculate G(n), the audio magnitude of loud segments is only compressed when the short term loudness level 138 is higher than the long term loudness level 136.

The loudness control system 100 may also include an optional target loudness terminal 140 for receiving a target loudness signal ($g_t(n)$). The target loudness signal ($g_t(n)$) may be a system audio magnitude target signal or may be derived from a volume control or from any other audio magnitude control.

The delay block 114 is coupled to the input terminal 102 to receive the input audio signal 120 and provides a delayed audio signal 128. The length of the delay introduced by delay block 114 is selected to approximately compensate for the processing delay through loudness detection block 104.

The multiplier 116 is coupled to the delay block 114 and the gain calculation block 112 to receive the delayed audio signal 128 and the gain control signal 126. Multiplier 116 amplifies the delayed audio signal 128 by the magnitude of the gain control signal 126 to provide an output audio signal 132 at the output terminal 118.

Figure 3:
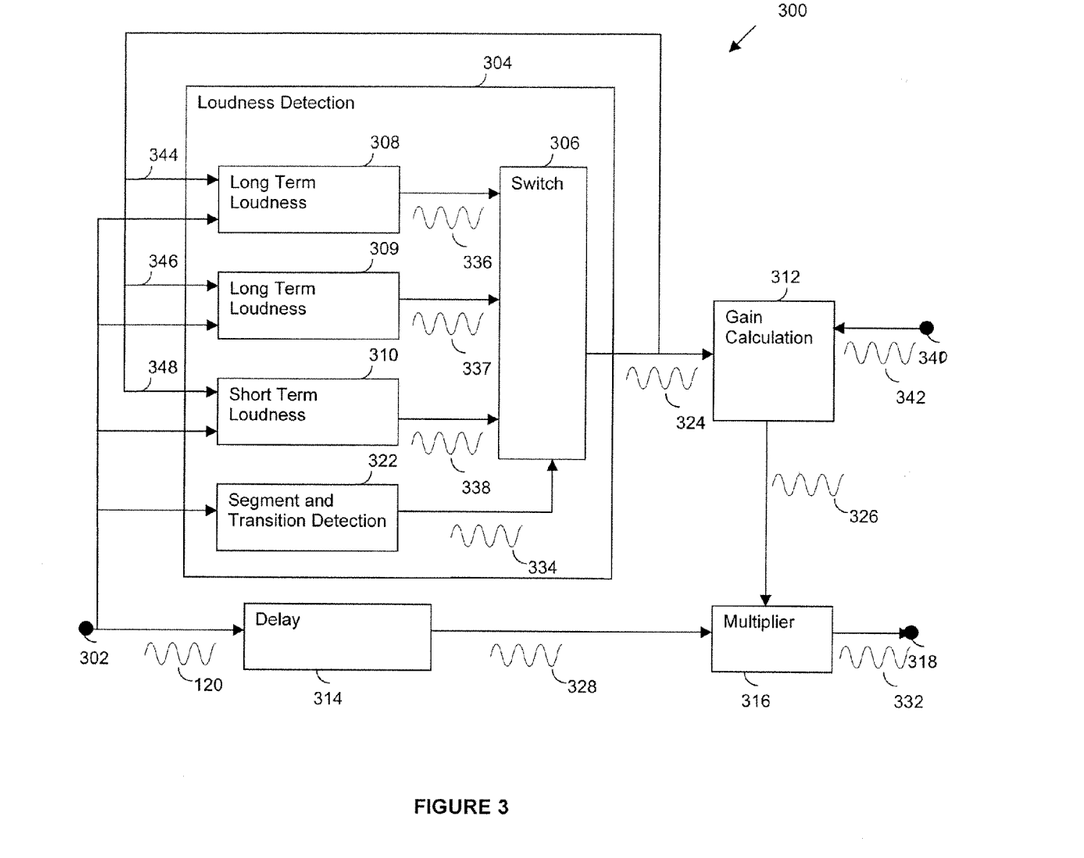
FIG. 3 schematically illustrates a loudness control system with a second long term loudness level block in accordance with an embodiment.

Reference is next made to FIG. 3, which illustrates a loudness control system 300 in accordance with another embodiment. Elements of loudness control system 300 that correspond to loudness control system 100 are identified by similar reference numerals. The loudness control system 300 includes, in addition to all of the elements of loudness control system 100, a second long term loudness level block 309. The second long term loudness level block 309 calculates a second long term loudness level 337 for the input audio signal 120. The second long term loudness level 337 corresponds to an average loudness level of the input audio signal 120 over the sliding time period $T_{l2}$ where $T_{l2}$ is longer than time period $T_s$, but shorter than time period $T_l$. In one embodiment $T_s$ is 300 milliseconds, $T_{l2}$ is 22 seconds and $T_l$ is 180 seconds.

In some embodiments the second long term loudness level 337 will be calculated using the same frequency weighting model as the long and short term loudness levels 336 and 338. In other embodiments, different frequency weighting models are used for the three calculations.

The switch 306 sets the loudness level signal 324 (L(n)) to one of the long term loudness level 336 ($L_{eq}(W)_l$), the second long term loudness level 337, and the short term loudness level 338 ($L_{eq}(W)_l$), based on the segment transition signal 334. In one embodiment, if the segment transition signal 334 indicates that the a segment transition has occurred, the switch 306 sets the loudness level signal 324 (L(n)) to the short term loudness level 338 ($L_{eq}(W)_s$) for time interval $T_x$. Once time interval $T_x$ has expired, the switch 306 sets the loudness level signal 324 (L(n)) to the second long term loudness level 337 ($L_{eq}(W)_l$) for time interval $T_y$ where time interval $T_y$ is greater than time interval $T_x$. Once time interval $T_y$ has expired the switch 306 sets the loudness level signal 324 (L(n)) to the long term loudness level 338.

The cycle is repeated each time there is a segment transition. In addition a new segment transition may break the cycle and restart it from the beginning.

$T_y$ may be selected to be equal to the average time of a loud segment. For example, when the input audio signal 120 corresponds to a television program containing commercials where each commercial lasts an average of 30 seconds, $T_y$ may be set to 30 seconds. In this way the gain calculation is based on the second long term loudness signal 337 for the entire loud segment 204 (i.e. a commercial).

The loudness control system 300 may also include feedback loops 344, 346, and 348 that feed the loudness level signal 324 (L(n)) output by the switch 306 to the long term loudness detection block 308, the second long term loudness detection block 309 and the short term loudness detection block 310 respectively. The feedback loops 344, 346 and 348 allow the loudness level calculations to be done recursively. This makes the loudness level calculations more hardware efficient because without the feedback loops 344, 346 and 348 the loudness detection blocks 308, 309 and 310 each have to store up to N samples for calculating the average over N samples and N can be large. For example, N is over 8 million when a sliding time period of 180 seconds is used and the sampling rate is 48 kHz.

When the loudness control system 300 includes feedback loops 344, 346, and 348 the loudness level $L_{eq}(W)$ may be calculated by the loudness level blocks 308, 309 and 310 according to the following equation:

$$y(n) = \frac{\alpha x_w^2(n)}{x_{ref}} + (1-\alpha)y(n-1)$$

$$L_{eq}(W) = 10\log_{10}[y(n)]$$

where $\alpha = 1/(T \cdot Fs)$ and T is the time period over which the average is calculated and Fs is the sampling rate of the input audio signal 120. For example, for the short term loudness level block 310, T is equal to time period $T_s$.

Figure 4:
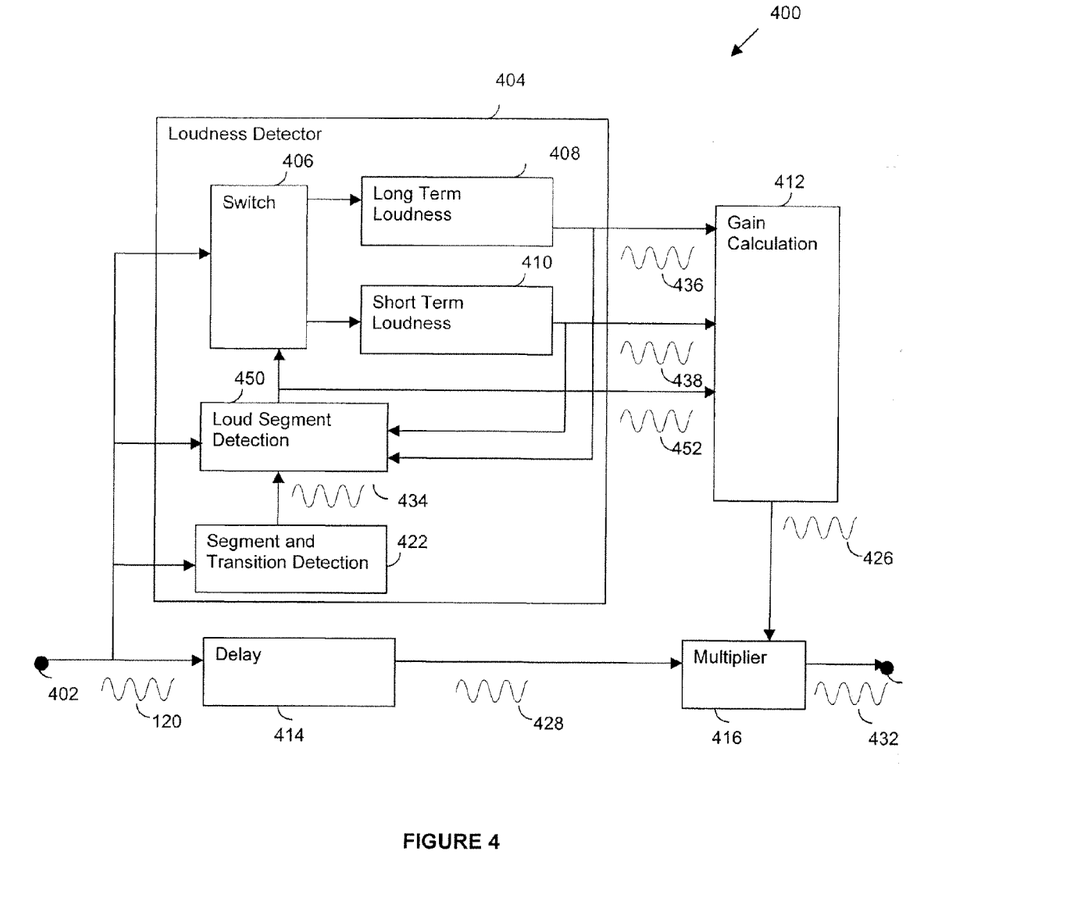
FIG. 4 schematically illustrates a loudness control system with a loud segment detection block in accordance with an embodiment.

Reference is next made to FIG. 4, which illustrates a loudness control system 400 in accordance with another embodiment. Elements of loudness control system 400 that correspond to loudness control systems 100 and 300 are identified by similar reference numerals. The key differences between loudness control system 100 and loudness control system 400 are that loudness control system 400 includes a loud segment detection block 450 and in loudness control system 400 the switch 406 precedes the short and long term loudness level blocks 408 and 410.

The loud segment detection block 450 determines whether the segment of the input audio signal 120 is a loud segment and outputs a loud segment signal 452. The loud segment detection bock 450 is coupled to the segment and transition block 422, the input port 402, the long term loudness level block 408, the short term loudness level block 410 and the switch 406. When the segment transition signal 434 indicates that a segment transition has occurred, the loud segment detection block 450 sets the loud segment signal 452 to Yes. The loud segment detection block 450 then examines the long and short term loudness levels 436 and 438 of the input audio signal 120 after the segment transition.

When the loud segment signal 452 is set to Yes, the switch 406 couples the input audio signal 120 to both the short term loudness level block 410 and the long term loudness level block 408. Both the short term loudness level block 410 and the long term loudness level 408 block begin to calculate the average loudness level of the input audio signal 120 after the segment transition over time interval $T_x$.

If at the end of time interval $T_x$ the short term loudness level 438 during the interval $T_x$ is statistically higher by a selected threshold than the long term loudness level 436 during the same interval $T_x$ for the input signal audio signal 120, then the segment of the input audio signal 120 following the segment transition is determined to be a loud segment and the loud segment signal 452 remains set to Yes.

The selected threshold may be any value, including any amount greater than 0%. If a small value is chosen, such as 0.1% of the segment will be treated as a loud segment if the short term loudness level 438 is even nominally higher than the long term loudness level 436 during the interval $T_x$. In other embodiments, the threshold may be 5%.

If at the end of the time interval $T_x$, the short term loudness level 438 during the interval $T_x$ is statistically at or below the selected threshold, then the segment following the segment transition is determined not to be a loud segment and the loud segment signal 452 is set to No. If the loud segment signal is set to No, the switch 406 couples the remainder of the input audio signal 120 until the next segment transition to the long term loudness level block 408 only.

For example, in one embodiment, during the time interval $T_x$, in a statistical comparison between the short term loudness level 438 and long term loudness level 436, the short term loudness level 438 is considered to be higher if it is higher by the selected threshold more than 50% of the time. In other embodiments, any threshold and other portions of the time interval $T_x$ may be used.

In one embodiment, the determination of a segment as a loud segment or not is performed during the interval $T_x$ after each segment transition. In other embodiments, the determination may continue after the time interval $T_x$. In such embodiments, if the loud segment signal is set to Yes for a segment of the input audio signal 120 at the end of the time interval $T_x$, both the short term loudness level 438 and the long term loudness level 436 are compared statistically continuously until the next segment transition is detected. If during this period, the continuous comparison indicates that the segment is a loud segment, the loud segment signal 452 remains set at Yes. If the continuous comparison indicates that the short term loudness level 438 does not continue to exceed the long term loudness level 436 by the selected threshold, the segment is subsequently treated as not being a loud segment and the loud segment signal 452 is set to No. The switch 306 then couples the remainder of the input audio signal 120 until the next segment transition to the long term loudness level block 308 only. For example, if the short term loudness level 438 is higher than the long term loudness level 436 by a selected threshold of 10% for 50% of the most recent 10 second period, the loud segment signal 452 will remain Yes; otherwise, the loud segment signal 452 will be set to No.

In system 400, the gain calculation block 412 receives the loud segment signal 452, the long term loudness level 436 and the short term loudness level 438 and calculates a gain control signal 426. The gain control signal 426 is generated to provide a gain of 1 (unity) when loud segment signal 452 is No indicating that the input audio signal 120 is presently in a normal segment 202.

When the loud segment signal is Yes, (i.e. during a loud segment 204 or after a segment transition in the input audio signal 120) the gain control signal 426 is derived from the difference between the long term loudness level 436 ($L_{eq}(W)_l$) and the short term loudness level 438 ($L_{eq}(W)_s$). In one embodiment the gain $G_l$ during a loud segment is generated in accordance with the following equation:

$$G_l = x_{ref} 10^{\frac{L_{eq}(W)_l - L_{eq}(W)_s}{20}}$$

It is possible that during a loud segment, the short term loudness level 438 may fall below the long term loudness level 436. To avoid amplification of a loud segment when this happens, the gain control signal 426 may be generated according to the following equation $$G_l = \min\left(1, x_{ref} 10^{\frac{L_{eq}(W)_l - L_{eq}(W)_s}{20}}\right)$$

This configuration allows the loudness level of portions of a loud segment that are louder than normal segments to be attenuated, but does not amplify the loudness level of portion of the loud segment that are quieter than normal segments.

In system 400, the input audio signal 120 is analyzed to determine whether it is in a normal segment or a loud segment. In some environments, the input audio signal 120 may be provided together with a loud segment signal. For example, some audio/video signals include commercial insertion cue signals which identify segments of audio/video signal that correspond to a commercial segment. In some embodiments, it is desirable to identify such commercials segments as the loud segments of the audio/video signal. The commercial insertion cue signals indicate the beginning and end of expected loud signals and in some embodiments, commercial segments identified as such are treated as loud segments without analyzing the actual loudness of the input audio signal. Similarly, other signals (i.e. radio broadcast signals) may include commercial insertion cue signals. Generally, such commercial insertion cue signals may be referred to as loud segment signals. In some embodiments, a loud segment signal may be provided by a person listening to or viewing the input signal. The person may press a button during a commercial segment (or any other particular type of segment) to indicate that the segment should be treated as a loud segment.

Figure 5:
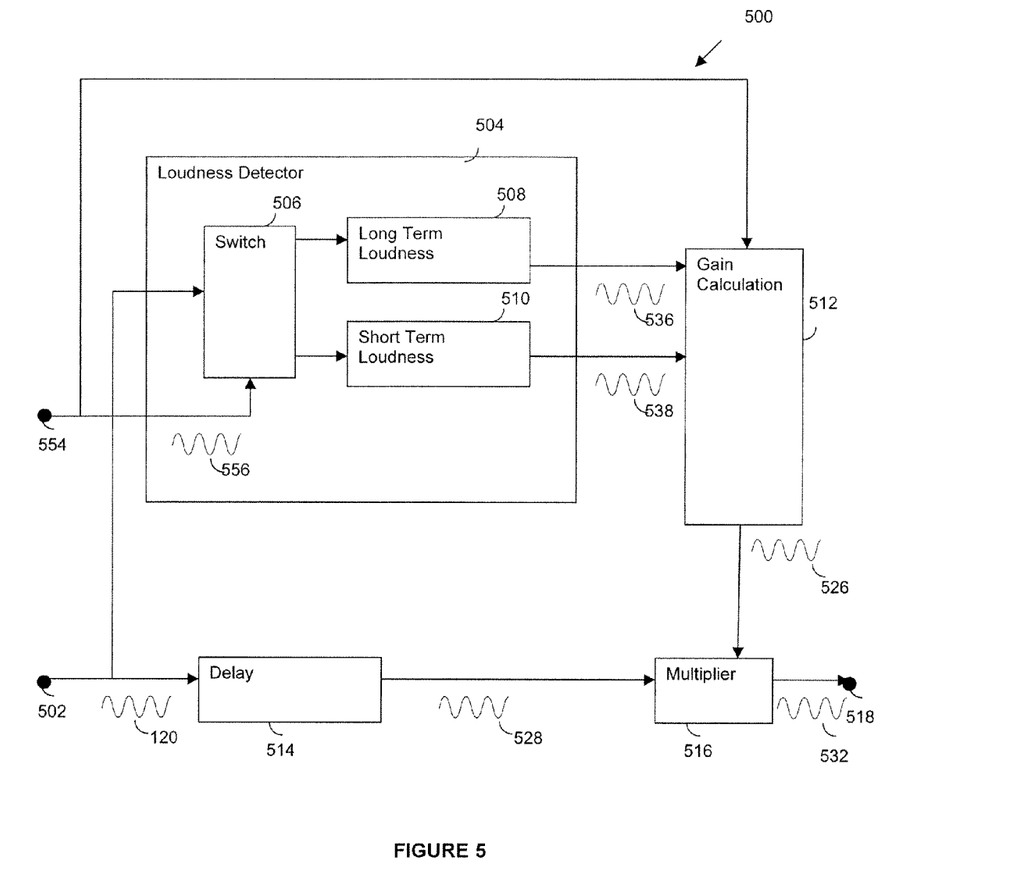
FIG. 5 schematically illustrates a loudness control system with a loud segment signal input in accordance with an embodiment.

Reference is next made to FIG. 5, which illustrates a loudness control system 500 in accordance with another embodiment. Loudness control system 500 includes a loud segment signal terminal 554 to receive a loud segment signal 556. The loud segment signal 556 is used to control the operation of the switch 506. Since loudness detection block 504 is not required to detect a loud segment in input audio signal 120, switch 506 may be coupled to long term loudness level block 510 from the beginning of a normal segment. The loud segment signal 556 is also coupled to the gain calculation block 512, which uses the loud segment signal 556 to identify whether the input audio signal 120 is in a normal segment or a loud segment.

In FIG. 5, the loud segment signal terminal 554 and loud segment signal 556 are illustrated separately from the input terminal 502 and the input audio signal 120. In some embodiments, the loud segment signal 556 will be integrated with the input audio signal 120 and will also be received at the input audio terminal 502.

In other embodiments of loudness control systems, the loudness detection block may maintain a database of segment signatures. Each time that a segment transition is detected, an initial portion of the input audio signal 120 is analyzed to calculate a signature. The newly calculated signature is compared with previously recorded signature and if the newly calculated signature matches a previously recorded signature, then a count of the number of times that the particular signature has been identified is increased. The count may be maintained on a sliding time basis so that only instances of the signature identified in a particular time period are counted. For example, the count may be maintained for a period of a day, a week, a month or some other time period. If the newly identified signature matches a previously identified signature for which the count exceeds a selected frequent segment threshold, then segment is treated as a loud segment. The frequent segment threshold may be selected based on the length of the time period for which the count is maintained. For example, if the time period is 10 days, then the frequent segment threshold may be 20 times. The frequent segment threshold is selected such that a commercial segment is likely to have been played more often than the selected threshold during the time period while program segments are likely to have been played less often than the threshold during the time period. This approach to identifying loud segments will typically identify frequently played segments such as commercials and station identification segments as loud segments. All such segments are then treated as loud segments and the audio magnitude of the segment may be attenuated, as described above.

The length of the initial portion may be any period of time. A longer period allows for more certain distinction of similar segments, but also requires the longer period to be completed before a segment can be identified as a loud segment. Typically, the initial period selected will be between 200 ms to 20 seconds, but may be shorter or longer than this range.

The present invention has been described here by way of example only. Various modification and variations may be made to these exemplary embodiments without departing from the spirit and scope of the invention, which is limited only by the appended claims.

The invention claimed is:

1. A method of generating a gain control signal comprising:
   determining a long term loudness level for an audio signal over a first sliding time period;

determining a short term loudness level for the audio signal over a second sliding time period wherein the second sliding time period is shorter than the first sliding time period;

detecting a segment transition in the audio signal; and generating a gain control signal, wherein the gain control signal is based on the short term loudness level for a first time interval after the segment transition and wherein the gain control signal is based on the long term loudness level after the expiration of the first time interval.

2. The method of claim 1 wherein at least one of the long term loudness level and the short term loudness level is determined using a frequency weighted Leq loudness model.

3. The method of claim 2 wherein the frequency weighted Leq loudness model is a revised low frequency B-weighted Leq (RLB) loudness model.

4. The method of claim 1 wherein only portions of the audio signal that are above a listener loudness perception threshold are used to determine the long term loudness level.

5. The method of claim 1 wherein only portions of the audio signal that are above a listener loudness perception threshold are used to determine the short term loudness level.

6. The method of claim 1 wherein the first sliding time period is at least ten times longer than the second sliding time period.

7. The method of claim 6 wherein the first sliding time period is greater than or equal to 10 seconds and the second sliding time period is less than or equal to 1 second.

8. The method of claim 1 wherein detecting a segment transition includes detecting a portion of the audio signal with a magnitude less than a selected transition audio threshold for a selected transition time threshold.

9. The method of claim 8 wherein the selected transition audio threshold is approximately −65 dB and the selected transition time threshold is approximately 100 milliseconds.

10. The method of claim 1 wherein the audio signal is part of an audio/video signal that includes a video signal and detecting a segment transition includes simultaneously detecting a quiet portion of the audio signal and a black portion of the video signal.

11. The method of claim 1 wherein the audio signal is part of an audio/video signal that includes a video signal and detecting a segment transition includes simultaneously detecting a quiet portion of the audio signal and a scene change in the video signal.

12. The method of claim 1 wherein the audio signal is an audio component of an audio/video signal and detecting a segment transition includes detecting a trigger signal.

13. The method of claim 12 where the trigger signal is a commercial insertion cue.

14. The method of claim 1 wherein the gain control signal is generated to achieve a target loudness level.

15. The method of claim 14 wherein the target loudness is determined in response to a target loudness signal.

16. The method of claim 1 wherein the short and long term loudness levels are determined recursively.

17. The method of claim 1 further comprising:

determining a second long term loudness level for the audio signal over a third sliding time period wherein the third sliding time period is shorter than the first sliding time period and longer than the second sliding time period; and wherein the gain control signal is based on:

the short term loudness level for the first time interval after a segment transition;

the second long term loudness level for a second time interval after the expiration of the first time interval; and the long term loudness level after the expiration of the second time interval.

18. The method of claim 17 wherein the audio signal includes loud segments and normal segments and the second time interval is approximately equal to an average length of the loud segments.

19. The method of claim 17 wherein the first sliding time period is 180 seconds, the second sliding time period is about 300 milliseconds and the third sliding time period is about 22 seconds.

20. The method of claim 17 wherein the first time interval is about 10 seconds and the second time interval is about 30 seconds.

21. The method of claim 17 further comprising:

determining a plurality of medium term loudness level for the audio signal, wherein each medium term loudness level is determined over a unique third sliding time period that is shorter than the first sliding time period and longer than the second sliding time period; and wherein the gain control signal is based on the short term loudness level for the first time interval after the segment transition, after expiration of the first time interval the gain control signal is based on the medium term loudness levels in series, each for an unique third time interval, and after expiration of all the unique third time intervals the gain control signal is based on the long term loudness level.

22. The method of claim 1 wherein the long term loudness level and short term loudness level are calculated continuously.

23. The method of claim 1 wherein the segment transition detection is continuously ongoing.

* * * * *